United States Patent
Chowdhury et al.

(10) Patent No.: US 10,089,428 B2
(45) Date of Patent: Oct. 2, 2018

(54) INTELLIGENT CELL SWAPPING BASED ON CEILING DETERMINATION, FLOOR DETERMINATION, AND CELL ATTRIBUTE WEIGHTING CRITERIA

(71) Applicants: Ahsan H. Chowdhury, Austin, TX (US); Robert A. Colyer, Austin, TX (US); John M. Fedor, Austin, TX (US); Brian Millar, Austin, TX (US); Yohan Kwon, Seoul (KR)

(72) Inventors: Ahsan H. Chowdhury, Austin, TX (US); Robert A. Colyer, Austin, TX (US); John M. Fedor, Austin, TX (US); Brian Millar, Austin, TX (US); Yohan Kwon, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 251 days.

(21) Appl. No.: 14/981,848

(22) Filed: Dec. 28, 2015

(65) Prior Publication Data
US 2016/0330661 A1 Nov. 10, 2016

Related U.S. Application Data

(60) Provisional application No. 62/156,799, filed on May 4, 2015.

(51) Int. Cl.
*G06F 17/50* (2006.01)

(52) U.S. Cl.
CPC ........ *G06F 17/5068* (2013.01); *G06F 17/505* (2013.01)

(58) Field of Classification Search
CPC ............. G06F 17/5081; G06F 17/5036; G06F 17/5063; G06F 2217/02; G06F 2217/12
See application file for complete search history.

(56) References Cited

U.S. PATENT DOCUMENTS

| 7,448,009 B2 | 11/2008 | Pundoor |
| 7,496,867 B2 | 2/2009 | Turner et al. |
| 7,849,422 B2 | 12/2010 | Sferrazza |
| 7,930,674 B2 | 4/2011 | Parker et al. |
| 2012/0131531 A1* | 5/2012 | Tirumala, Sr. ...... G06F 17/5031 716/113 |
| 2014/0289694 A1* | 9/2014 | Ma ...................... G06F 17/5077 716/129 |

* cited by examiner

*Primary Examiner* — Vuthe Siek
(74) *Attorney, Agent, or Firm* — Renaissance IP Law Group LLP

(57) ABSTRACT

Embodiments of the inventive concept include a computer-implemented method for intelligently swapping circuit cells and an associated intelligent cell swapper logic section. The technique can include receiving, by an intelligent cell swapper logic section, a synthesized gate level netlist including cells each having an initial cell class. A cell class sorter can sort cell classes in order of leakage. A ceiling finder can swap the initial cell class for each of the cells to a highest cell leakage class, and determine a ceiling frequency. A floor finder can swap the highest cell leakage class for each of the cells to a lowest cell leakage class, and determine a floor frequency. An effective swap weight calculator section can determine an effective swap weight for a subset of cells based on cell attribute weighting criteria. The timing paths can be optimized to meet the ceiling frequency without unnecessarily using high leakage cells.

16 Claims, 10 Drawing Sheets

INTELLIGENT CELL SWAPPING BASED ON CEILING DETERMINATION, FLOOR DETERMINATION, AND CELL ATTRIBUTE WEIGHTING CRITERIA

RELATED APPLICATION DATA

This application claims the benefit of U.S. Patent Application Ser. No. 62/156,799, filed May 4, 2015, which is hereby incorporated by reference.

BACKGROUND

The present inventive concepts relate to cell designs in circuits, and more particularly, cell swapping techniques, devices, and systems based on a ceiling determination, a floor determination, and cell attribute weighting criteria.

Standard cell designs in computer circuits are continually being pushed to meet higher frequency targets and/or lower power dissipation. Higher leakage cells have a higher frequency performance, although at the expense of increased power dissipation. Lower leakage cells have a lower frequency performance, although with the advantage of reduced power dissipation. Conventional tools are inadequate for obtaining a favorable balance between higher leakage and lower leakage cells, thereby causing final circuit designs to suffer both poor performance and high power dissipation. Moreover, conventional techniques result in mismanaged or wasted cell leakage. In other words, each highest leakage cell used in conventional designs does not necessarily improve the maximum frequency achievable. Embodiments of the present inventive concept address these and other limitations in the prior art.

BRIEF SUMMARY

Embodiments of the inventive concept can include a computer-implemented method for intelligently swapping circuit cells. The method can include receiving, by an intelligent cell swapper logic section, a synthesized gate level netlist including a plurality of cells each having an initial cell class. The method can include sorting, by a cell class sorter, a plurality of cell classes in order of leakage. The method can include swapping, by a ceiling finder, the initial cell class for each of the plurality of cells to a highest cell leakage class from among the plurality of cell classes. The method can include determining a ceiling frequency of the design containing a plurality of cells. The method can include swapping, by a floor finder, the highest cell leakage class for each of the plurality of cells in the design to a lowest cell leakage class from among the plurality of cell classes. The method can include determining a floor frequency of the design.

Embodiments of the inventive concept can include an intelligent cell swapper. The intelligent cell swapper can include an intelligent cell swapper logic section configured to receive a synthesized gate level netlist of the design, including a plurality of cells each having an initial cell class, a cell class sorter configured to sort a plurality of cell classes in order of leakage, a ceiling finder configured to swap the initial cell class for each of the plurality of cells to a highest cell leakage class from among the plurality of cell classes, wherein the ceiling finder is configured to determine a ceiling frequency of the design containing a plurality of cells, and a floor finder configured to swap the highest cell leakage class for each of the plurality of cells to a lowest cell leakage class from among the plurality of cell classes, wherein the floor finder is configured to determine a floor frequency of the design.

An effective swap weight calculator section can determine an effective swap weight for subsets of cells based on cell attribute weighting criteria. The weightings can be used to optimize the timing paths to meet the ceiling frequency without unnecessarily using high leakage cells.

BRIEF DESCRIPTION OF THE DRAWINGS

The foregoing and additional features and advantages of the present inventive principles will become more readily apparent from the following detailed description, made with reference to the accompanying figures, in which.

DETAILED DESCRIPTION

Figure 1:
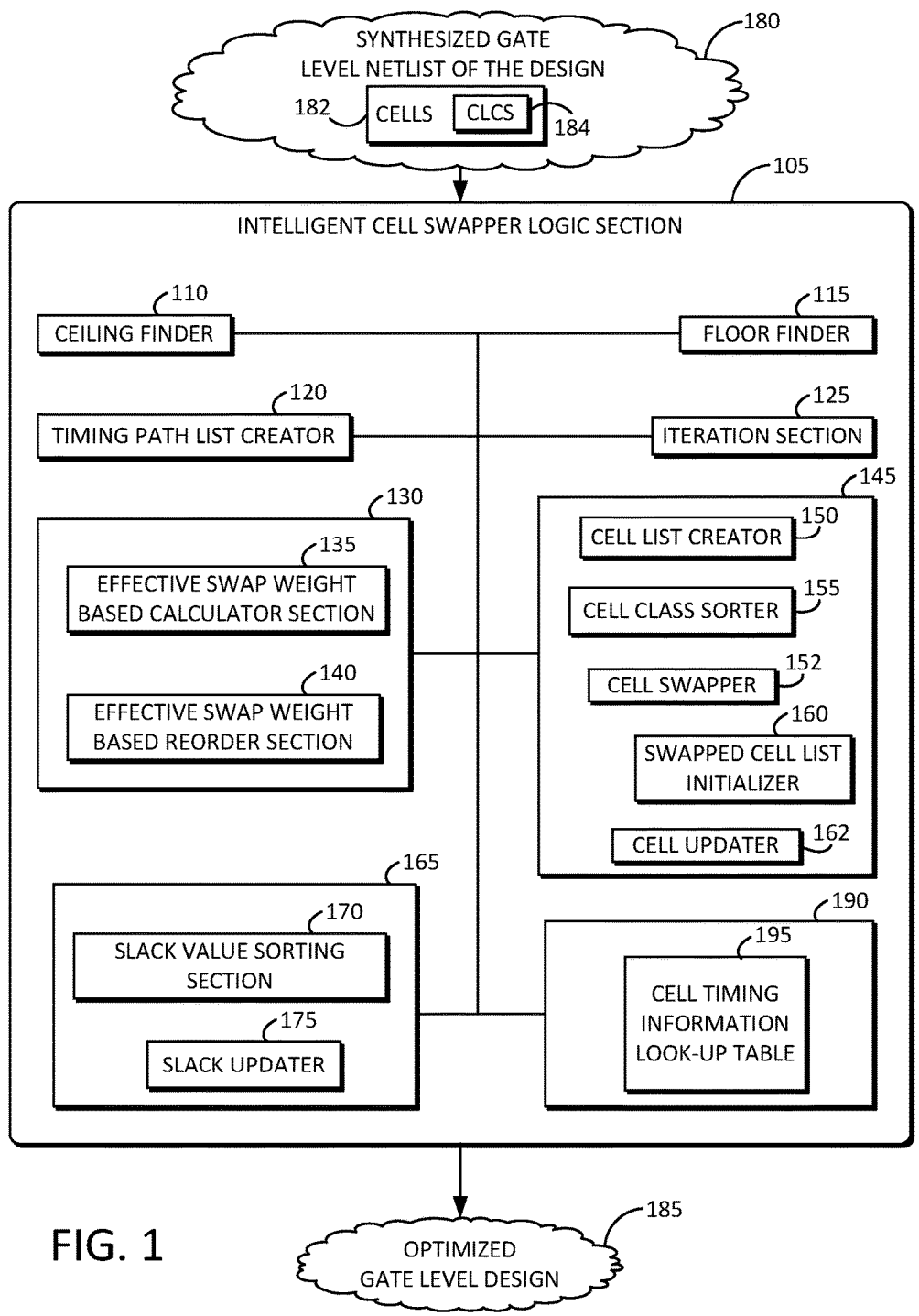
FIG. 1 is an example block diagram of an intelligent cell swapper logic section in accordance with embodiments of the inventive concept.

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first cell could be termed a second cell, and, similarly, a second cell could be termed a first cell, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Embodiments of the inventive concept can optimize a standard cell-based design to achieve a higher frequency than could otherwise be achieved with only low leakage cells (i.e., standard or high Vt cells). In addition, embodiments of the inventive concept disclosed herein can achieve the highest frequency possible without unnecessarily using high leakage cells. Moreover, embodiments of the inventive concept can reduce the processing time for arriving at the optimized circuit design.

Implementing a more stringent usage of high leakage cells, embodiments of the inventive concept incorporate the high leakage cells into the design only if they improve the maximum frequency achieved. Any number of different leakage families of cells can be used. In some embodiments, any cells that are not in any critical timing path to achieve the maximum frequency can be swapped to the lowest leakage cell available.

In some embodiments, by reducing the highest leakage cell count (i.e., lowest Vt), targeted process tweaking can be more readily enabled than if the usage of different Vt types was not properly managed. Targeted process tweaking can further improve the maximum frequency achieved. Embodiments of the inventive concept disclosed herein are implementation friendly, as they can be deployed at any stage of the design build with minimal disruption to the design.

FIG. 1 is an example block diagram of an intelligent cell swapper logic section 105 in accordance with embodiments of the inventive concept. The intelligent cell swapper logic section 105 can receive a synthesized gate level netlist of a design 180, process the synthesized gate level netlist 180, and generate an optimized gate level design 185. The synthesized gate level netlist 180 can include multiple cells 182 having multiple cell leakage classes 184.

In some embodiments, a cell leakage class can be distinguished one from another by a particular threshold voltage, channel length, oxide thickness, or the like. For example, a high threshold voltage (HVt) leakage class and a regular threshold voltage (RVt) leakage class can be defined as different classes. By way of another example, a library with minimum channel length and a library with greater than minimum channel length can be defined as different cell leakage classes. By way of yet another example, a low power process oxide thickness (LP) leakage class and a general process oxide thickness (GP) leakage class can be defined as different leakage classes. In other words, different leakage classes can have an ordering among themselves in terms of higher and lower leakage, or the like. The HVt library would be lower leakage than the RVt library for equivalent cells. A minimum channel length library would be higher leakage, for example, than a greater than minimum channel length library for equivalent cells. Similarly, the LP leakage class would be generally lower leakage than the GP leakage class for equivalent cells. It will be understood that any suitable kind of class can be defined within a leakage class hierarchy.

The intelligent cell swapper logic section 105 can include a ceiling finder 110 and a floor finder 115, which can determine a ceiling frequency and a floor frequency of the design, respectively, as described in detail below with reference to the flow diagram of FIGS. 2A and 2B and the state diagram of FIGS. 3A through 3F. The intelligent cell swapper logic section 105 can include a timing path list creator 120 and an iteration section 125, which are also described in detail below.

In some embodiments, the intelligent cell swapper logic section 105 can include an effective swap weight logic section 130. The effective swap weight logic section 130 can include an effective swap weight based calculator section 135 and an effective swap weight based reorder section 140, which are also described in detail below.

In some embodiments, the intelligent cell swapper logic section 105 can include a cell logic section 145. The cell logic section 145 can include a cell list creator 150, a cell class sorter 155, a cell swapper 152, a swapped cell list initializer 160, and a cell updater 162, which are described in detail below.

In some embodiments, the intelligent cell swapper logic section 105 can include a slack logic section 165. The slack logic section 165 can include a slack value sorting section 170 and a slack updater 175, which are described in detail below.

In some embodiments, the processing time for arriving at the optimized circuit design can be reduced. This can include using a fast timer to get timing updates more quickly. For example, the intelligent cell swapper logic section 105 can include a cell timing logic section 190, which can parse and calculate changes in cell delay based on the standard liberty format representation of the cells' timing between different cell leakage classes 195. This information can be fed back into the slack updater 175 to accurately update the timing of a path. By accessing this information outside of traditional place and route tools, a large number of swaps can be accurately performed in a relatively short period of time, thereby conserving machine processing cycles during optimization, as further described below.

Figure 2A:
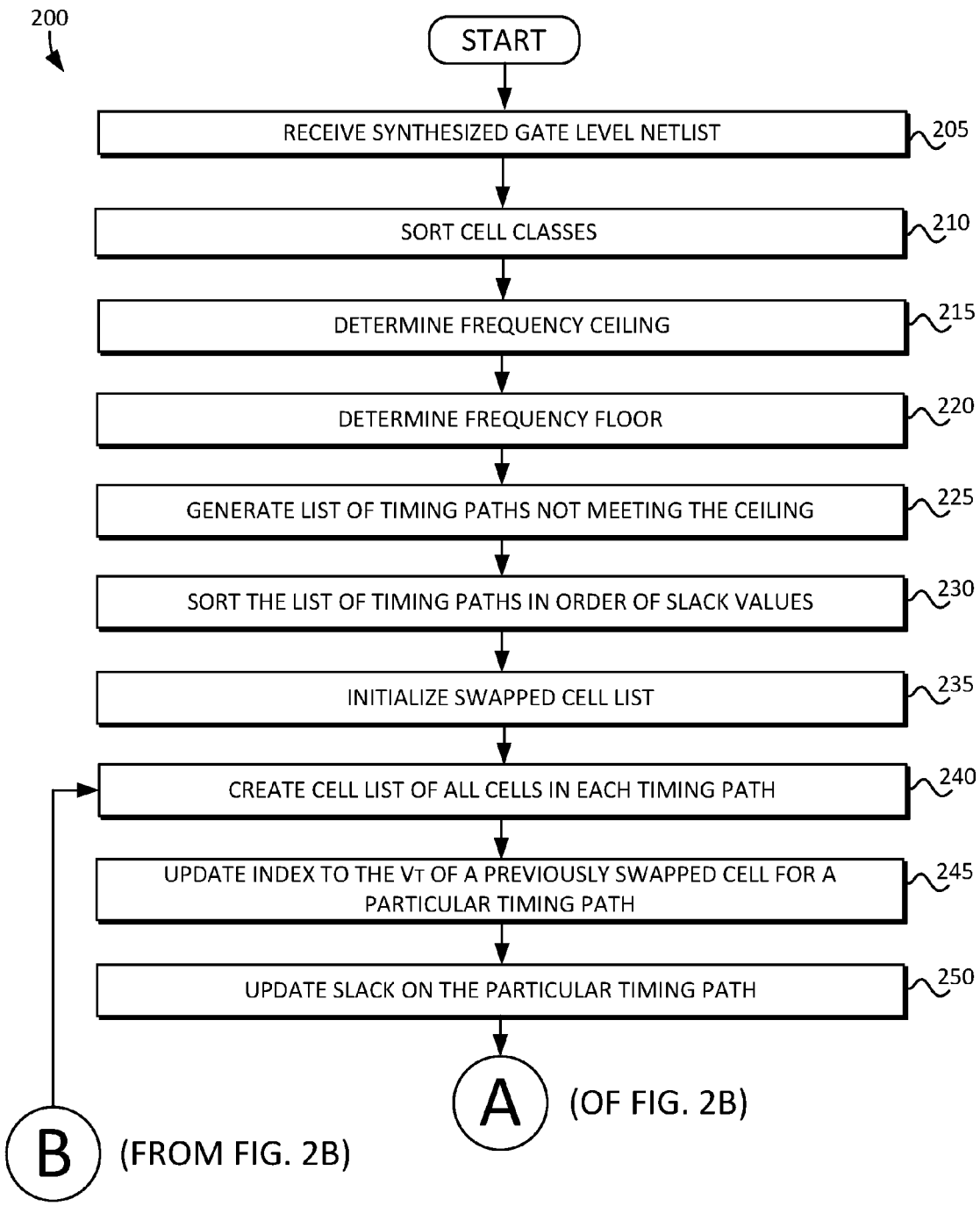
FIGS. 2A and 2B include a flow diagram illustrating an example technique for intelligently swapping cells in a circuit design in accordance with embodiments of the inventive concept.
Figure 2B:
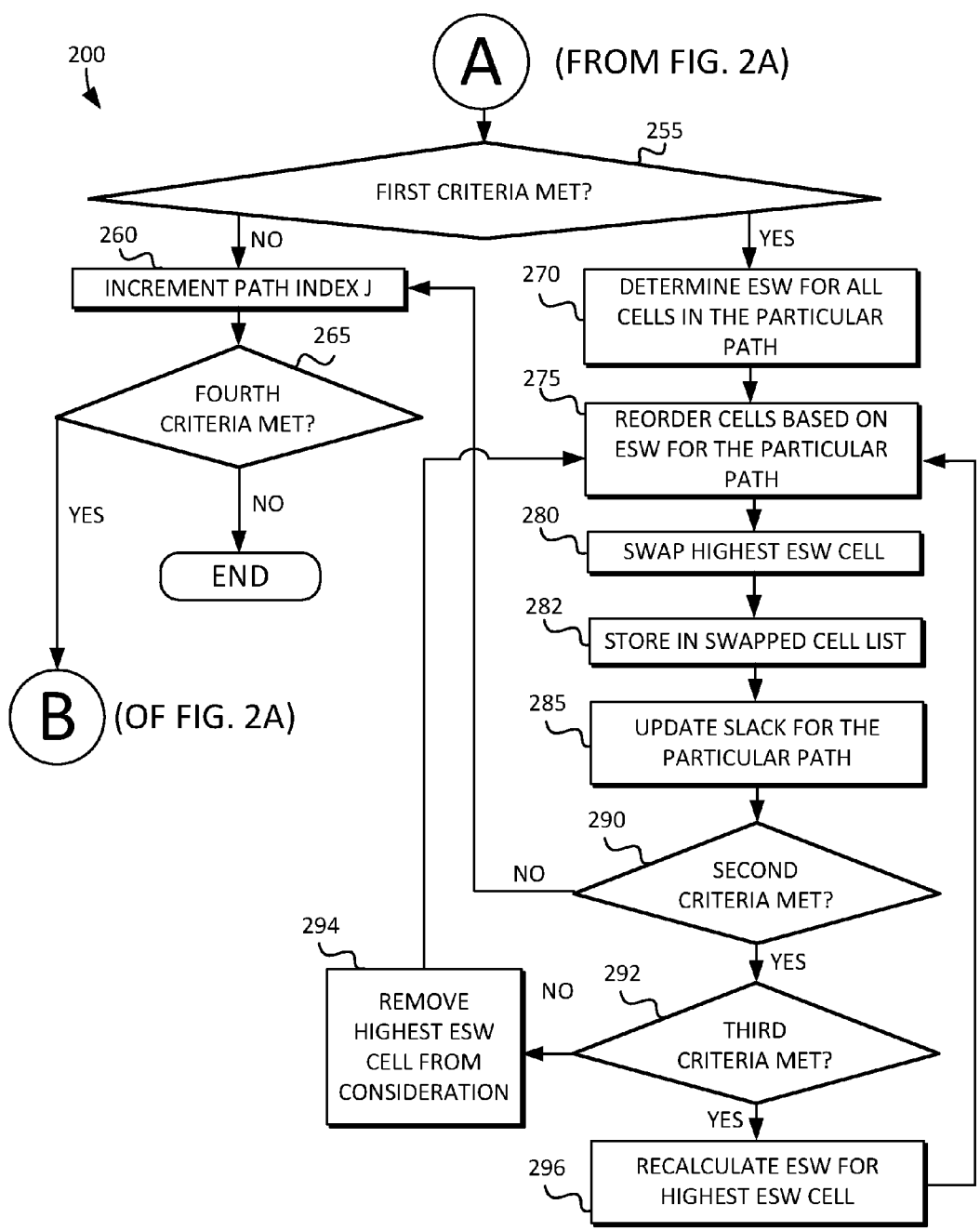

FIGS. 2A and 2B include a flow diagram 200 illustrating an example technique for intelligently swapping cells in a circuit design in accordance with embodiments of the inventive concept. FIGS. 3A through 3F illustrate a state diagram 300 illustrating an example technique for intelligently swapping cells in a standard cell based circuit design in accordance with embodiments of the inventive concept. Reference is now made to FIGS. 1, 2A, 2B, and 3A through 3F.

Figure 3A:
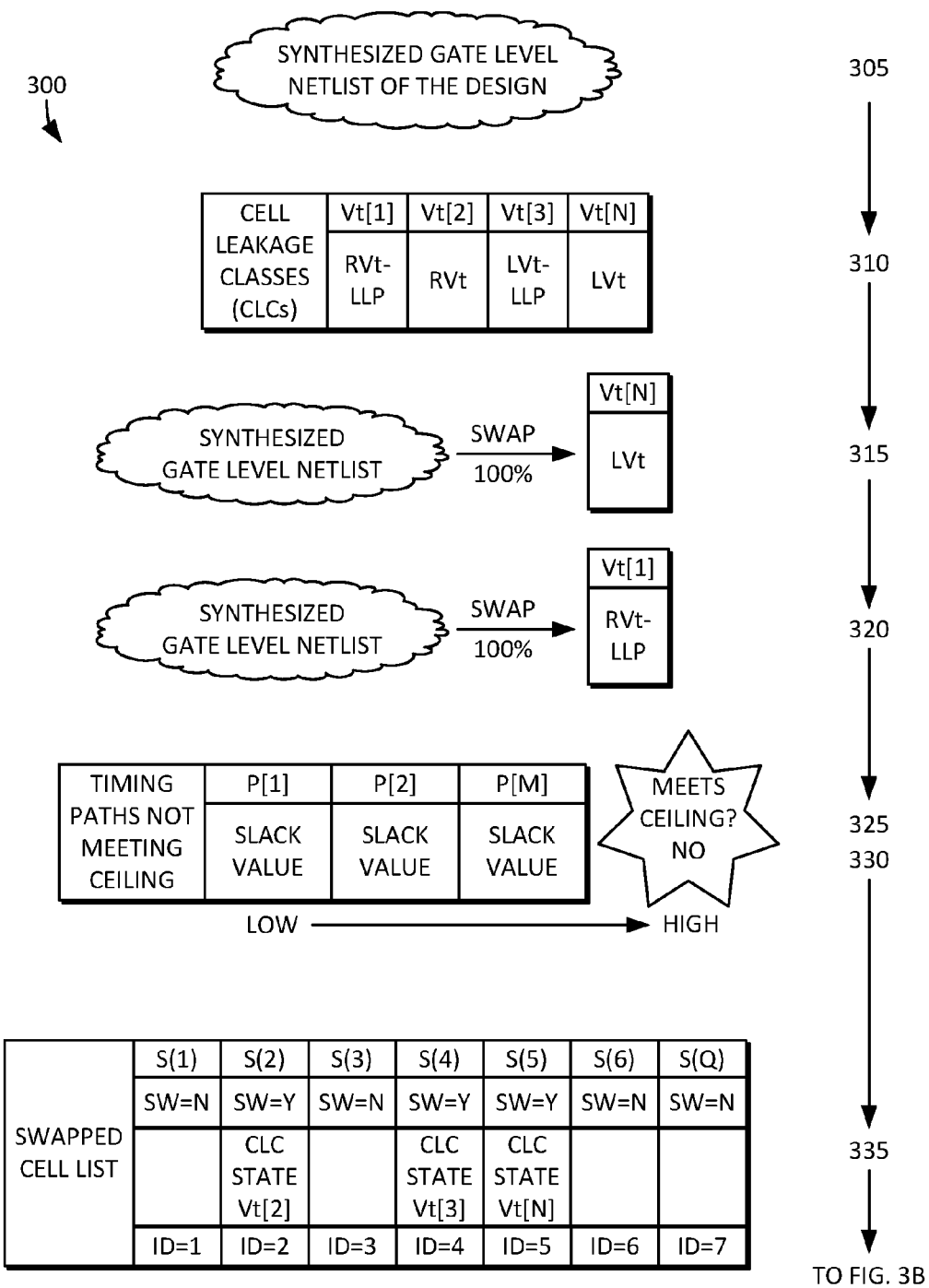
FIGS. 3A through 3F illustrate a state diagram illustrating an example technique for intelligently swapping cells in a circuit design in accordance with embodiments of the inventive concept.
Figure 3B:
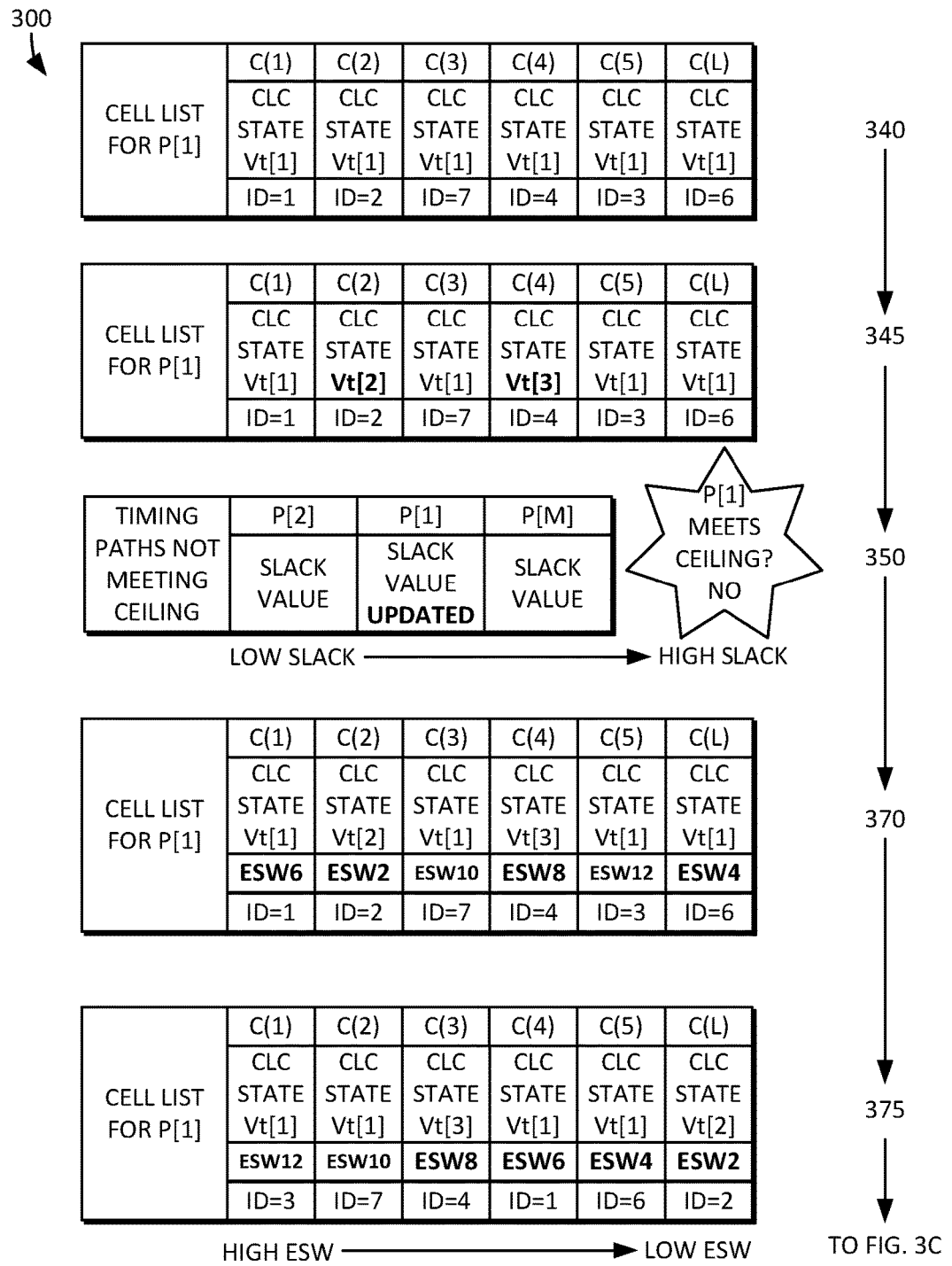
Figure 3C:
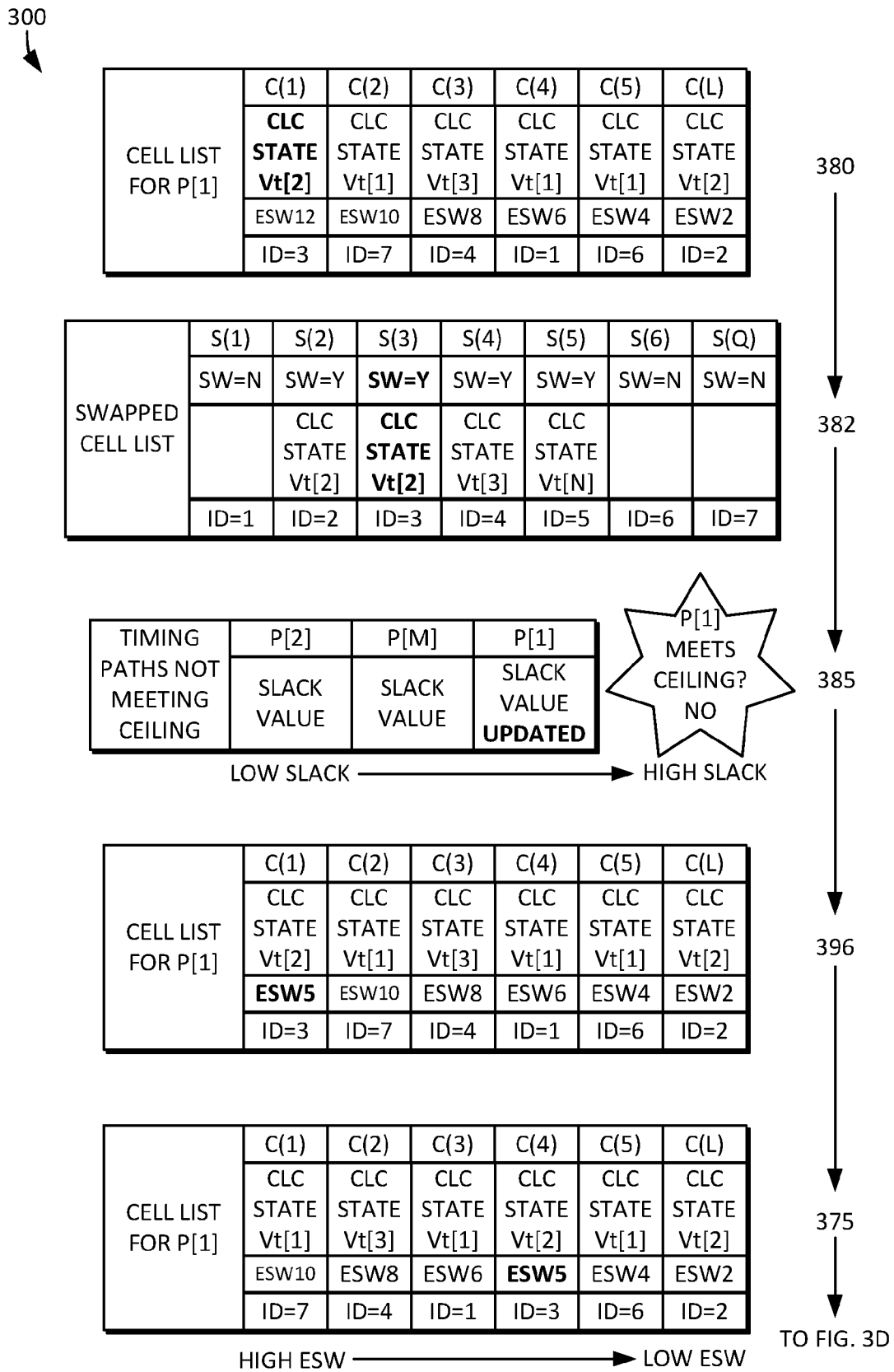
Figure 3D:
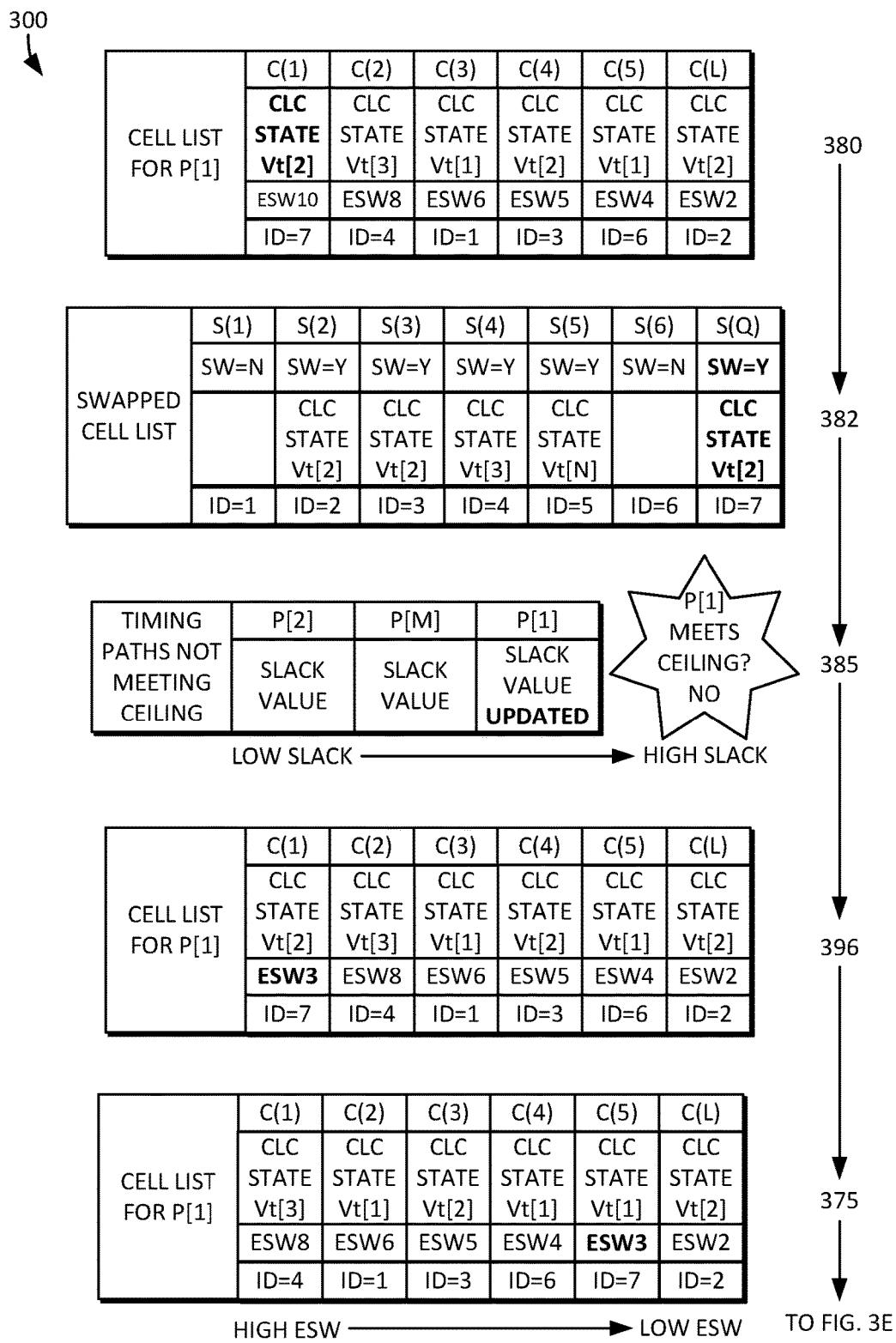
Figure 3E:
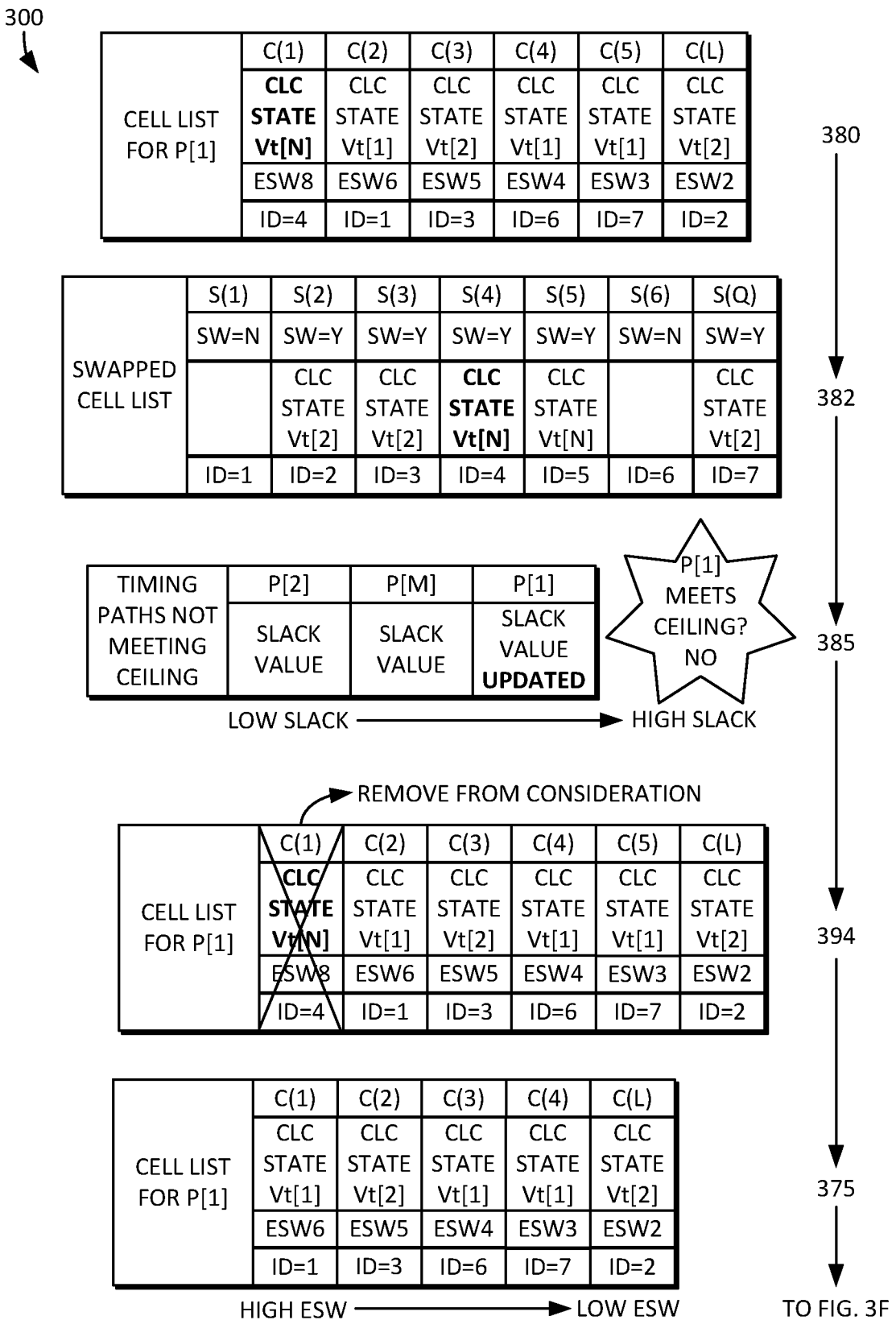
Figure 3F:
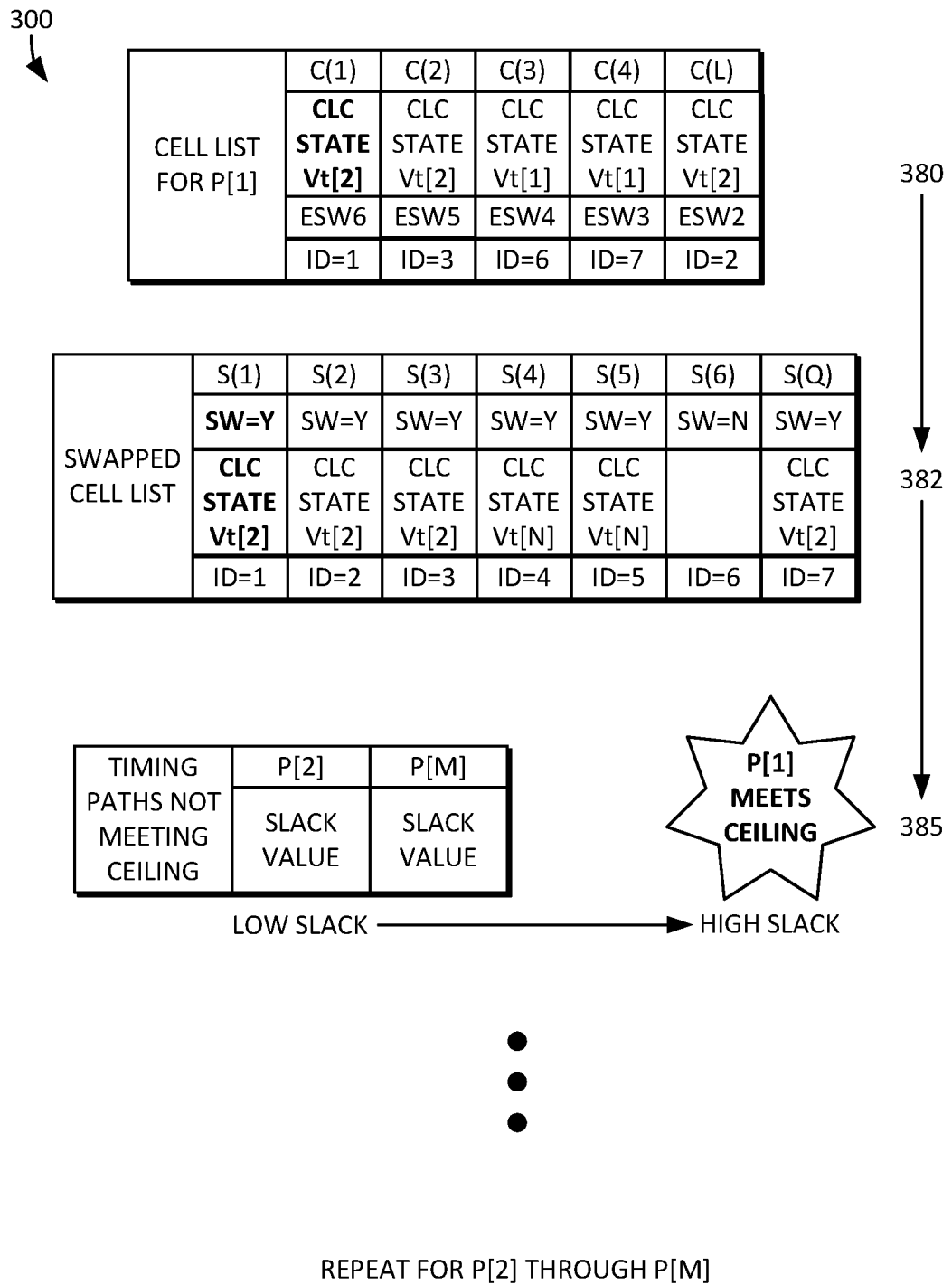

The technique can begin at 205 of the flow diagram of FIG. 2A, and at 305 of the state diagram of FIG. 3A, where a synthesized gate level netlist of the design 180 can be received by the intelligent cell swapper logic section 105. The synthesized netlist 180 can come from any point in the design flow, including but not limited to, synthesis, placement, or final routed database. The synthesized gate level netlist 180 can include multiple cells 182 each having an initial cell leakage class from a plurality of cell leakage classes 184, or otherwise capable of being classified in a particular leakage class, as shown in FIG. 1 and at 310 of FIG. 3A. For example, the cell leakage classes 184 can include regular threshold voltage long channel length transistors (RVt-LLP) cell leakage class, a regular threshold voltage (RVt) cell leakage class, a low threshold voltage long channel length transistors (LVt-LLP) cell leakage class, a low threshold voltage (LVt) cell leakage class, or the like. It will be understood that any suitable cell leakage class can be included in the cell leakage classes 184. The RVt-LLP, RVt, LVt-LLP, and LVt cell leakage classes can be represented by Vt[1], Vt[2], Vt[3], and Vt[N] labels, respectively, as shown at 310. It will be understood that a cell can include one or more transistors. The one or more transistors can be configured as an AND gate, a NAND gate, an OR gate, a NOR gate, flip-flop, and/or any other suitable gate or cell.

At 210 of the flow diagram of FIG. 2A, the cell class sorter 155 can sort multiple cell leakage classes in order of leakage, for example, as shown in the state diagram at 310 of FIG. 3A. For example, the cell class sorter 155 can sort the cell leakage classes in ascending order of leakage, e.g., Vt[1], Vt[2], Vt[3], to Vt[N]. In this example embodiment, the lowest leakage class is Vt[1] and the highest leakage class is Vt[N], where N is the number of leakage classes that are defined.

At 215 of the flow diagram of FIG. 2A, a ceiling frequency of the design 180 can be determined. More specifically, the ceiling finder 110 can swap the initial cell leakage class 184 for each of the cells 182 to a highest cell leakage class (e.g., Vt[N]), for example, as shown at 315 of the state diagram of FIG. 3A. In other words, the ceiling finder 110 can map all cells 182 of the gate level netlist of the design 180 to all cells of the highest leakage class—in this example, LVt. When all cells are mapped to the leakiest cells, they will be the fastest cells that are available. In this manner, the maximum obtainable frequency can be measured. This is based on the timing of the path with the worst slack. With the given synthesis implementation, it is the fastest the circuit design could run without restructuring, resizing, or the like. Once the ceiling is determined, the measurement can be retained or otherwise stored for later reference.

At 220 of the flow diagram of FIG. 2A, a floor frequency of the design 180 can be determined. More specifically, the floor finder 115 can swap the now-highest cell leakage class (e.g., Vt[N]) for each of the cells 182 to a lowest cell leakage class (e.g., Vt[1]), for example, as shown at 320 of the state diagram of FIG. 3A. In other words, the floor finder 115 can map all the cells 182 of the gate level netlist of the design 180 to all cells of the lowest leakage class—in this example, RVt-LLP. This is the lowest leakage the design can achieve. In this state, the maximum frequency ceiling cannot be "met" or otherwise achieved using only the lowest leakage cells. But starting from the floor baseline, higher leakage class cells can be gradually added to meet the maximum frequency ceiling target without including unnecessary higher leakage class cells. Once a higher leakage class cell is added to the design, then it can remain within the design. In this manner, a stringent approach can be applied in which higher leakage class cells are only used if they improve the overall frequency of the circuit design.

At 225 of the flow diagram of FIG. 2A, the timing path list creator 120, which could be any conventional static timing analysis tool, can generate a list (e.g., P[1], P[2], through P[M]) of timing paths, associated with the gate level design 180, that do not meet the ceiling frequency. In other words, the timing paths that do not meet the ceiling frequency can be generated and stored in the list of timing paths. The list of timing paths (e.g., P[1], P[2], through P[M]) is shown at 325 of the state diagram of FIG. 3A.

At 230 of the flow diagram of FIG. 2A, the slack value sorting section 170 can sort the list of the timing paths (e.g., P[1], P[2], through P[M]) in order of slack values, where M is the total number of timing paths in the list not meeting the ceiling frequency. For example, as shown at 330 of the state diagram of FIG. 3A, the timing paths can be sorted in ascending order of negative slack (i.e., most critical to least critical). As shown at 330 of FIG. 3A, for example, timing path P[1] has a most critical slack, timing path P[2] has a medium critical slack, and timing path P[M] has a least critical slack. In other words, the timing paths not meeting the ceiling frequency can be ordered from low slack to high slack. As shown at 330 of FIG. 3A, in this example state, none of the timing paths P[1], P[2], and P[M] currently meet the ceiling frequency. In other words, the frequency under which each of these timing paths can reliably operate is below the ceiling frequency. Each of the timing paths can be evaluated and adjusted. For this example, timing path P[1] can be initially evaluated.

At 235 of the flow diagram of FIG. 2A, the swapped cell list initializer 160 can initialize a swapped cell list. An example swap cell list (e.g., S(1), S(2), S(3), S(4), S(5), S(6), through S(Q)) is shown at 335 of the state diagram, although in the initialized state, the cell leakage class (CLC) states would be blank and the list would show that no cells had yet been swapped. For the sake of the present example, however, the swapped cell list at 335 is shown to have three cells that have been swapped thus far. Specifically, cells with identifiers (IDs) 2, 4, and 5 at locations S(2), S(4), and S(5) within the swapped cell list (e.g., S(1), S(2), S(3), S(4), S(5), S(6), through S(Q)), respectively, are shown to have been swapped. The IDs can each be a globally unique cell instance name or any other suitable unique identifier. The swapped cell list can track all previously swapped cells and their corresponding CLC state (e.g., Vt[1], Vt[2], Vt[3], or Vt[N]).

At 240 of the flow diagram of FIG. 2A, the cell list creator 150 can create a cell list including a subset of the cells 182 for a particular timing path (e.g., P[1]). An example of a cell list for P[1] is shown at 340 of the state diagram of FIG. 3B. The cell list for P[1], for example, can include all cells in the timing path P[1] and their current CLC state (e.g., Vt[1], Vt[2], Vt[3], or Vt[N]). The cell list can include list entries C(1), C(2), C(3), C(4), C(5), through C(L), where L is the total number of cells within a particular path (e.g., P[1]). Each cell within the cell list can have an ID. The ID can be the globally unique cell instance name or any other suitable unique identifier.

At 245 of the flow diagram of FIG. 2A, the cell list (e.g., C(1), C(2), C(3), C(4), C(5), through C(L)) of a particular timing path (e.g., P[1]) can be checked for any cells that are present in the swapped cell list (e.g., S(1), S(2), S(3), S(4), S(5), S(6), through S(Q)). A current cell leakage class can be updated, for example by cell updater 162, to an updated cell leakage class, of any previously swapped cells associated with the swapped cell list (e.g., C(1), C(2), C(3), C(4), C(5), through C(L)) that are within the subset of cells associated with the particular timing path (e.g., P[1]). For example, as shown at 345 of the state diagram of FIG. 3B, the cell list for P[1] can have two cells that are updated. Specifically, cell with ID 2 in position C(2) can have its CLC state updated from Vt[1] to Vt[2] because the cell with ID 2 is also present in the swapped cell list as shown at 335 of the state diagram of FIG. 3A. Similarly, cell with ID 4 with position C(4) can have its CLC state updated from Vt[1] to Vt[3] because the cell with ID 4 is also present in the swapped cell list as shown at 335 of the state diagram of FIG. 3A. After such updates, the cells with IDs 2 and 4 in the cell list can have the same CLC state as the cells with IDs 2 and 4 in the swapped cell list. At this point, the cell list for P[1] can be in an updated state relative to the swapped cell list.

At 250 of the flow diagram of FIG. 2A, the slack updater 175 can update the slack value on the particular timing path (e.g., P[1]). The updated slack value for P[1] is shown at 350 of the state diagram of FIG. 3B. The flow diagram continues through the circle A to FIG. 2B. At 255 of FIG. 2B, a determination can be made whether first criteria are met. The first criteria can be whether or not the slack of a particular path (e.g., P[1]) meets the ceiling frequency of the design. Alternatively or in addition, the first criteria can be whether or not the index i (e.g., 1, 2, 3, N) of any cell leakage class (e.g., Vt[1], Vt[2], Vt[3], Vt[N]) for each cell in the cell list (e.g., C(1), C(2), C(3), C(4), C(5), through C(L)) associated with a particular path (e.g., P[1]) is less than N. In other words, if slack meets the ceiling frequency or the index i is equal to N for all cells in the particular timing path, then the first criteria are not met. Conversely, if slack does not meet the ceiling frequency and if the index i<N for any cell in the particular timing path, then the first criteria are met.

In response to determining that the first criteria are met, then the slack can be improved. In this case, the effective swap weight based calculator section 135 can determine, at 270 of the flow diagram of FIG. 2B, an effective swap weight (ESW) for each cell that is part of the subset of cells (e.g., C(1), C(2), C(3), C(4), C(5), through C(L)) associated with the particular timing path (e.g., P[1]). For example, as shown at 370 of the state diagram of FIG. 3B, the cell with ID 1 at position C(1) is determined to have an ESW of ESW6. It will be understood that each ESW, such as the ESW6, is representative of a weight value, which can be a fraction or decimal weight, for example. Similarly, the cell with ID 2 at position C(2) is determined to have an ESW of ESW2, the cell with ID 7 at position C(3) is determined to have an ESW of ESW10, the cell with ID 4 at position C(4) is determined to have an ESW of ESW8, the cell with ID 3 at position C(5) is determined to have an ESW of ESW12, and the cell with ID 6 at position C(L) is determined to have an ESW of ESW4.

The ESW can be a weighted combination of cell attributes associated with a particular path. The ESW can be user-defined. For example, the cell attributes can include an area of a cell, a delay difference between different CLCs, a leakage difference between different CLCs, fanout from a cell, fanin to the cell, slack of a cell, transistor configuration, or the like. Depending on the requirements of a circuit design, the user can tune the ESW function by varying the weighting of each of the applicable cell attributes.

The ESW can be defined by the following Equation 1:

$$ESW = a(i)^{w(i)} * \ldots * a(n)^{w(n)}, \quad \text{Equation 1:}$$

where a represents cell attributes, i represents an index, w represents a variable weighting, and n represents an upper index.

It will be understood that other suitable ESW formulas and/or equations can be used without departing from the scope of the present inventive concept.

At 275 of the flow diagram of FIG. 2B, the effective swap weight based reorder section 140 can reorder the subset of cells (e.g., C(1), C(2), C(3), C(4), C(5), through C(L)) associated with the particular timing path (e.g., P[1]) in order of the effective swap weight. For example, the cells can be sorted in descending order of ESW value. More specifically, as shown at 375 of the state diagram of FIG. 3B, the cells can be sorted so that the cell with ID 3 and ESW12 is in the position C(1), the cell with ID 7 and ESW10 is in the position C(2), the cell with ID 4 and ESW8 is in the position C(3), the cell with ID 1 and ESW6 is in the position C(4), the cell with ID 6 and ESW4 is in the position C(5), and the cell with ID 2 and ESW2 is in the position C(L).

At 280 of the flow diagram of FIG. 2B, the cell swapper 152 can swap a cell class (e.g., Vt[1]) of a cell (e.g., cell with cell ID 3 in position C(1)) having the highest effective swap weight (e.g., ESW12) from among the reordered subset of the cells (e.g., C(1), C(2), C(3), C(4), C(5), through C(L)), with a new cell class (e.g., Vt[2]). For example, as shown at 380 of the state diagram of FIG. 3C, the cell having ID 3 in position C(1) is updated to have the new cell class Vt[2], which is a higher performing and higher leaking class than Vt[1].

At 282 of the flow diagram of FIG. 2B, the new cell leakage class (e.g., Vt[2]) can be stored in the swapped cell list (e.g., S(1), S(2), S(3), S(4), S(5), S(6), S(Q)). For example, as shown at 382 of the state diagram of FIG. 3C, the cell having ID 3 and CLC state Vt[2] can be stored in position S(3) of the swapped cell list. A swapped indicator (SW) associated with the S(3) position can change from no (N) to yes (Y), meaning that the cell having cell ID 3 associated with the S(3) position has been swapped at least once.

At 285 of the flow diagram of FIG. 2B, after swapping and storing, the slack updater 175 can update the slack on the particular timing path (e.g., P[1]). For example, as shown at 385 of the state diagram of FIG. 3C, the updated slack value for P[1] is updated. Although the particular path P[1] still does not meet the ceiling frequency at this stage, it is nevertheless closer to meeting it. In other words, the particular path P[1] has a higher slack value than before swapping the cell leakage class of the cell with cell ID 3 above.

At 290 of the flow diagram of FIG. 2B, a determination can be made whether second criteria are met. The second criteria can include whether or not the slack of a particular path (e.g., P[1]) meets the ceiling frequency. Alternatively or in addition, the second criteria can be whether or not the index i (e.g., 1, 2, 3, N) of the cell leakage class (e.g., Vt[1], Vt[2], Vt[3], Vt[N]) for each cell in the cell list (e.g., C(1), C(2), C(3), C(4), C(5), through C(L)) associated with a particular path (e.g., P[1]) is less than N. In other words, if slack meets the ceiling frequency or the index i is equal to N for all cells in the particular timing path, then the second criteria are not met. Conversely, if slack does not meet the ceiling frequency and if the index i<N for any cell in the particular timing path, then the second criteria are met.

In response to determining that the second criteria are met at 290, a determination can be made whether or not third criteria are met at 292. The third criteria can include whether or not i<N for the cell in position C(1) of the cell list. For example, the cell having ID 3 in position C(1) at this stage has an index i of 2, meaning the cell leakage class state is currently Vt[2]. Since i<N in this case, then the third criteria is met, and the flow can then proceed to 296 of the flow diagram of FIG. 2B.

At 296 of the flow diagram of FIG. 2B, the effective swap weight based calculator section 135 can recalculate an effective swap weight for the cell (e.g., cell having ID 3 in position C(1)) having the new cell class (e.g., Vt[2]). For example, as shown at 396 of the state diagram of FIG. 3C, the cell having ID 3 in position C(1) of the cell list can have the effective swap weight recalculated and/or updated from ESW12 to ESW5.

The flow can return to 275 of the flow diagram of FIG. 2B, where the effective swap weight based reorder section 140 can again reorder the subset of cells (e.g., C(1), C(2), C(3), C(4), C(5), through C(L)) associated with the particular timing path (e.g., P[1]) in order of the effective swap weight. More specifically, as shown at 375 of the state diagram of FIG. 3C, the cells can be sorted so that the cell with ID 7 and ESW10 is in the position C(1), the cell with ID 4 and ESW8 is in the position C(2), the cell with ID 1 and ESW6 is in the position C(3), the cell with ID 3 and ESW5 is in the position C(4), the cell with ID 6 and ESW4 is in the position C(5), and the cell with ID 2 and ESW2 is in the position C(L).

The flow can proceed to 280 of the flow diagram of FIG. 2B, where the cell swapper 152 can swap a cell class (e.g., Vt[1]) of a cell (e.g., cell with cell ID 7 in position C(1 )) having the highest effective swap weight (e.g., ESW10 ) from among the reordered subset of the cells (e.g., C(1 ), C(2 ), C(3 ), C(4 ), C(5 ), through C(L)), with a new cell class (e.g., Vt[2 ]). For example, as shown at 380 of the state diagram of FIG. 3D, the cell having ID 7 in position C(1 )

can be updated to have the new cell class Vt[2], which is a higher performing and higher leaking class than Vt[1].

The flow can proceed to 282 of the flow diagram of FIG. 2B, where the new cell leakage class (e.g., Vt[2]) can be stored in the swapped cell list (e.g., S(1), S(2), S(3), S(4), S(5), S(6), S(Q)). For example, as shown at 382 of the state diagram of FIG. 3D, the cell having ID 7 and CLC state Vt[2] can be stored in position S(Q) of the swapped cell list. A swapped indicator (SW) associated with the S(Q) position can change from no (N) to yes (Y), meaning that the cell having cell ID 7 associated with the S(Q) position has been swapped at least once.

The flow can proceed to 285 of the flow diagram of FIG. 2B, where after swapping and storing the second time, the slack updater 175 can update the slack on the particular timing path (e.g., P[1]). For example, as shown at 385 of the state diagram of FIG. 3D, the updated slack value for P[1] can be updated. Although the particular path P[1] still does not meet the ceiling frequency at this stage, it is nevertheless closer to meeting it. In other words, the particular path P[1] has a higher slack value than before swapping the cell leakage class of the cell with cell ID 7 above.

The flow can proceed to 290 of the flow diagram of FIG. 2B, where another determination can be made whether the second criteria are met. As explained above, if slack meets the ceiling frequency or the index i is equal to N for all cells in the particular timing path, then the second criteria are not met. Conversely, if slack does not meet the ceiling frequency and if the index i<N for any cell in the particular timing path, then the second criteria are met.

In response to determining that the second criteria are met at 290, a determination can be made whether or not third criteria are met at 292. As explained above, the third criteria can include whether or not i<N for the cell in position C(1) of the cell list. For example, the cell having ID 7 that is now in position C(1) at this stage has an index i of 2, meaning the cell leakage class state is currently Vt[2]. Since i<N in this case, then the third criteria is met, and the flow can then proceed to 296 of the flow diagram.

At 296 of the flow diagram of FIG. 2B, the effective swap weight based calculator section 135 can recalculate an effective swap weight for the cell (e.g., cell having ID 7 in position C(1)) having the new cell class (e.g., Vt[2]). For example, as shown at 396 of the state diagram of FIG. 3D, the cell having ID 7 in position C(1) of the cell list can have the effective swap weight recalculated and updated from ESW10 to ESW3.

The flow can return to 275 of the flow diagram of FIG. 2B, where the effective swap weight based reorder section 140 can again reorder the subset of cells (e.g., C(1), C(2), C(3), C(4), C(5), through C(L)) associated with the particular timing path (e.g., P[1]) in order of the effective swap weight. More specifically, as shown at 375 of the state diagram of FIG. 3D, the cells can be sorted so that the cell with ID 4 and ESW8 is in the position C(1), the cell with ID 1 and ESW6 is in the position C(2), the cell with ID 3 and ESW5 is in the position C(3), the cell with ID 6 and ESW4 is in the position C(4), the cell with ID 7 and ESW3 is in the position C(5), and the cell with ID 2 and ESW2 is in the position C(L).

The flow can proceed to 280 of the flow diagram of FIG. 2B, where the cell swapper 152 can swap a cell class (e.g., Vt[3]) of a cell (e.g., cell with cell ID 4 in position C(1)) having the highest effective swap weight (e.g., ESW8) from among the reordered subset of the cells (e.g., C(1), C(2), C(3), C(4), C(5), through C(L)), with a new cell class (e.g., Vt[N]). For example, as shown at 380 of the state diagram of FIG. 3E, the cell having ID 4 in position C(1) can be updated to have the new cell class Vt[N], which is a higher performing and higher leaking class than Vt[3].

The flow can proceed to 282 of the flow diagram of FIG. 2B, where the new cell leakage class (e.g., Vt[N]) can be stored in the swapped cell list (e.g., S(1), S(2), S(3), S(4), S(5), S(6), S(Q)). For example, as shown at 382 of the state diagram of FIG. 3E, the cell having ID 4 and CLC state Vt[N] can be stored in position S(4) of the swapped cell list. A swapped indicator (SW) associated with the S(4) position can change from no (N) to yes (Y) (or otherwise remain as yes), meaning that the cell having cell ID 4 associated with the S(4) position has been swapped at least once.

The flow can proceed to 285 of the flow diagram of FIG. 2B, where after swapping and storing the third time, the slack updater 175 can update the slack on the particular timing path (e.g., P[1]). For example, as shown at 385 of the state diagram of FIG. 3E, the updated slack value for P[1] is updated. Although the particular path P[1] still does not meet the ceiling frequency at this stage, it is nevertheless closer to meeting it. In other words, the particular path P[1] has a higher slack value than before swapping the cell leakage class of the cell with cell ID 4 above.

At 294 of the flow diagram of FIG. 2B, in response to determining that the third criteria is not met at 292 of the flow diagram of FIG. 2B, the cell (e.g., cell having ID 4 in position C(1)) having the new class (e.g., Vt[N]) can be removed from consideration. In other words, if a particular cell were to have the cell leakage class of Vt[N], it would not be less than N, and no further optimizations would be possible on this particular cell. Therefore, such a cell can be removed from the optimization technique, and the focus can be placed on other cells within the cell list that still can be optimized. For example, as shown at 394 of the state diagram of FIG. 3E, the cell with ID 4 and cell leakage class Vt[N] can be removed from consideration.

The flow can return to 275 of the flow diagram of FIG. 2B, where the effective swap weight based reorder section 140 can yet again reorder the subset of cells (e.g., C(1), C(2), C(3), C(4), C(5), through C(L)) associated with the particular timing path (e.g., P[1]) in order of the effective swap weight. More specifically, as shown at 375 of the state diagram of FIG. 3E, the cells can be sorted so that the cell with ID 1 and ESW6 is in the position C(1), the cell with ID 3 and ESW5 is in the position C(2), the cell with ID 6 and ESW4 is in the position C(3), the cell with ID 7 and ESW3 is in the position C(4), and the cell with ID 2 and ESW2 is in the position C(L).

The flow can proceed to 280 of the flow diagram of FIG. 2B, where the cell swapper 152 can swap a cell class (e.g., Vt[1]) of a cell (e.g., cell with cell ID 1 in position C(1)) having the highest effective swap weight (e.g., ESW6) from among the reordered subset of the cells (e.g., C(1), C(2), C(3), C(4), C(5), through C(L)), with a new cell class (e.g., Vt[2]). For example, as shown at 380 of the state diagram of FIG. 3F, the cell having ID 1 in position C(1) is updated to have the new cell class Vt[2], which is a higher performing and higher leaking class than Vt[1].

The flow can proceed to 282 of the flow diagram of FIG. 2B, where the new cell leakage class (e.g., Vt[2]) can be stored in the swapped cell list (e.g., S(1), S(2), S(3), S(4), S(5), S(6), S(Q)). For example, as shown at 382 of the state diagram of FIG. 3F, the cell having ID 1 and CLC state Vt[2] can be stored in position S(1) of the swapped cell list. A swapped indicator (SW) associated with the S(1) position can change from no (N) to yes (Y) (or otherwise remain as yes), meaning that the cell having cell ID 1 associated with the S(1) position has been swapped at least once.

The flow can proceed to 285 of the flow diagram of FIG. 2B, where after swapping and storing for yet another time, the slack updater 175 can update the slack on the particular timing path (e.g., P[1]). For example, as shown at 385 of the state diagram of FIG. 3F, the updated slack value for P[1] can be updated. At this stage, the particular path P[1] meets the ceiling frequency. In other words, the particular path P[1] can reliably operate at a frequency that is substantially equivalent to the ceiling frequency while using the fewest number of high leakage cells that are necessary to meet the ceiling.

After the particular path P[1] is optimized so that it can reliably operate at the frequency that is substantially equivalent to the ceiling frequency, similar techniques disclosed herein can be applied to paths P[2] through P[M] such that all timing paths can be optimized to reliably operate at a frequency that is substantially equivalent to the ceiling frequency while using the fewest number of high leakage cells that are necessary to meet the ceiling.

Referring back to the determinations made at 255 and 290 of the flow diagram of FIG. 2B, in response to determining, respectively, that the first criteria are not met at 255, or that the second criteria are not met at 290, the flow can proceed to 260, where an index j for the list of timing paths (e.g., P[1], P[2], P[M]) can be incremented. In other words, the evaluation can shift from P[1] to P[2], and then from P[2] to P[M], and so forth. Put differently, once it is determined that the slack can no longer be improved for a particular path, then the flow can proceed to the next path for further optimization.

At 265 of the flow diagram shown in FIG. 2B, a determination can be made whether or not fourth criteria are met. The fourth criteria can include whether the index j for the list of timing paths (e.g., P[1], P[2], P[M]) is less than M, the total number of timing paths to be evaluated. In other words, if there are still timing paths to be evaluated and optimized, then the flow can return through circle B to FIG. 2A. Specifically, the flow can return to 240 of the flow diagram of FIG. 2A, where the process can be substantially repeated for the next timing path. In another words, yet another cell list can be created by the cell list creator 150 that includes a second subset of the cells 182 for the particular timing path (e.g., P[2]). This process can repeat until all timing paths have been fixed, analyzed, and/or completed.

The steps and elements of FIGS. 2A and 2B need not occur in the order as illustrated, but rather, can occur in a different order or with various intervening steps.

Embodiments of the inventive concept can achieve a higher maximum frequency and/or a lower usage of high leakage cells as compared with results associated with available commercial synthesis tools. In addition, embodiments of the inventive concept can improve the marketability and/or usability of the product. Moreover, embodiments of the inventive concept can improve the battery life of the product.

Embodiments of the inventive concept can empirically find the maximum frequency that can be achieved with cell swapping, while ensuring that each high leakage cell is used effectively. A smart weighting criteria can be applied when the cells get analyzed for swapping. Embodiments of the inventive concept can provide an analysis of maximum frequency versus high leakage cell usage (an indicator of total leakage power) to allow system tradeoffs to be made. Embodiments of the inventive concept are implementation friendly, as it can be deployed at any stage of the design build with minimal disruption to the circuit design.

Figure 4:
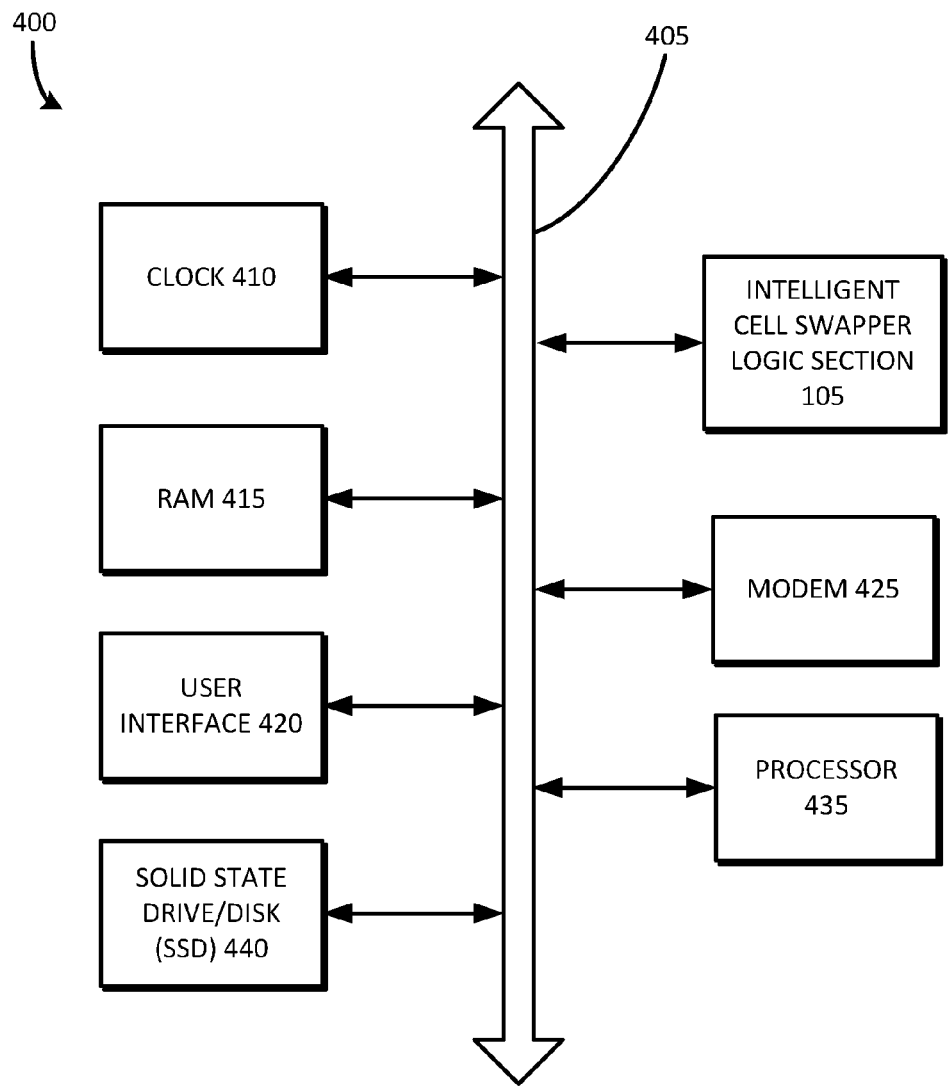
FIG. 4 is a block diagram of a computing system including the intelligent cell swapper logic section of FIG. 1.

FIG. 4 is a block diagram of a computing system 400 including the intelligent cell swapper logic section of FIG. 1. The computing system 400 can include a clock 410, a random access memory (RAM) 415, a user interface 420, a modem 425 such as a baseband chipset, a solid state drive/disk (SSD) 440, and/or a processor 435, any or all of which may be electrically coupled to a system bus 405. The computing system 400 can include the intelligent cell swapper logic section 105 of FIG. 1, which may also be electrically coupled to the system bus 405. The intelligent cell swapper logic section 105 can include or otherwise interface with the clock 410, the random access memory (RAM) 415, the user interface 420, the modem 425, the solid state drive/disk (SSD) 440, and/or the processor 435.

The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the present inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the inventive concept with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

Embodiments of the inventive concept may include a non-transitory machine-readable medium comprising instructions executable by one or more processors, the instructions comprising instructions to perform the elements of the inventive concepts as described herein.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

What is claimed is:

1. A computer-implemented method for intelligently swapping circuit cells, comprising:
    receiving, by an intelligent cell swapper logic section, a synthesized gate level netlist including a design having a plurality of cells each having an initial cell leakage class;
    sorting, by a cell class sorter, a plurality of cell classes in order of leakage;
    swapping, by a ceiling finder, the initial cell leakage class for each of the plurality of cells to a highest cell leakage class from among the plurality of cell classes;
    determining a ceiling frequency of the design, wherein determining the ceiling frequency of the design includes determining a maximum obtainable frequency associated with the synthesized gate level netlist;
    swapping, by a floor finder, the highest cell leakage class for each of the plurality of cells to a lowest cell leakage class from among the plurality of cell classes;
    determining a floor frequency of the design, wherein determining the floor frequency of the design includes determining a lowest leakage the design can achieve associated with the synthesized gate level netlist;
    generating, by a timing path list creator, a list of a plurality of timing paths, associated with the plurality of cells, that do not meet the ceiling frequency of the design;
    sorting, by a slack value sorting section, the list of the plurality of timing paths in order of slack values;
    initializing, by a swapped cell list initializer, a swapped cell list;
    creating, by a cell list creator, a cell list including a subset of the plurality of cells for a particular timing path from among the plurality of timing paths; and
    updating a current cell class, to an updated cell class, of any previously swapped cells associated with the swapped cell list that are within the subset of the plurality of cells associated with the particular timing path.

2. The computer-implemented method of claim 1, further comprising:
    updating, by a slack updater, a slack on the particular timing path;
    determining whether first criteria are met; and
    in response to determining that the first criteria are met, determining, by an effective swap weight calculator section, an effective swap weight for each cell that is part of the subset of the plurality of cells associated with the particular timing path.

3. The computer-implemented method of claim 2, further comprising:
    reordering, by an effective swap weight reorder section, the subset of the plurality of cells associated with the particular timing path in order of the effective swap weight; and
    swapping, by a cell swapper, a cell class of a cell having a highest effective swap weight from among the reordered subset of the plurality of cells, with a new cell class from among the plurality of cell classes.

4. The computer-implemented method of claim 3, further comprising:
    storing, in the swapped cell list, the new cell class of the cell.

5. The computer-implemented method of claim 4, further comprising:
    after swapping and storing, updating, by the slack updater, the slack on the particular timing path;
    determining whether second criteria are met;
    in response to determining that the second criteria are met, determining whether third criteria are met; and
    in response to determining that the third criteria are met, recalculating, by the effective swap weight calculator section, an effective swap weight for the cell having the new cell class.

6. The computer-implemented method of claim 5, further comprising:
    in response to determining that the third criteria are not met, removing the cell having the new class from consideration.

7. The computer-implemented method of claim 5, wherein the particular timing path is referred to as a first particular timing path, the method further comprising:
    in response to determining that the second criteria are not met, incrementing, by an iteration section, an index of the list of the plurality of timing paths, thereby selecting a second particular timing path for evaluation.

8. The computer-implemented method of claim 7, wherein the cell list is referred to as a first cell list, and the subset is referred to as a first subset, the method further comprising:
    determining whether fourth criteria are met; and
    in response to determining that the fourth criteria are met, creating, by the cell list creator, a second cell list including a second subset of the plurality of cells for the second particular timing path from among the plurality of timing paths,
    wherein the first criteria includes whether or not the slack on the particular timing path meets the ceiling frequency of the design;
    wherein the second criteria includes whether or not the slack on the particular timing path meets the ceiling frequency of the design;

wherein the third criteria includes whether or not a cell leakage class index is less than a number of defined leakage classes for a given cell of the cell list; and wherein the fourth criteria includes whether or not the index of the list of the plurality of timing paths is less than a total number of timing paths.

9. An intelligent cell swapper, comprising:

an intelligent cell swapper logic section configured to receive a synthesized gate level netlist including a design having a plurality of cells each having an initial cell leakage class;

a cell class sorter configured to sort a plurality of cell classes in order of leakage;

a ceiling finder configured to swap the initial cell leakage class for each of the plurality of cells to a highest cell leakage class from among the plurality of cell classes, wherein the ceiling finder is configured to determine a ceiling frequency of the design by at least determining a maximum obtainable frequency associated with the synthesized gate level netlist; and a floor finder configured to swap the highest cell leakage class for each of the plurality of cells to a lowest cell leakage class from among the plurality of cell classes, wherein the floor finder is configured to determine a floor frequency of the design by at least determining a lowest leakage the design can achieve associated with the synthesized gate level netlist;

a timing path list creator configured to generate a list of a plurality of timing paths, associated with the plurality of cells, that do not meet the highest frequency of the design;

a slack value sorting section configured to sort the list of the plurality of timing paths in order of slack values;

a swapped cell list initializer configured to initialize a swapped cell list;

a cell list creator configured to create a cell list including a subset of the plurality of cells for a particular timing path from among the plurality of timing paths; and a cell updater configured to update a current cell class, to an updated cell class, of any previously swapped cells associated with the swapped cell list that are within the subset of the plurality of cells associated with the particular timing path.

10. The intelligent cell swapper of claim 9, further comprising:

a slack updater configured to update a slack on the particular timing path; and an effective swap weight calculator section configured to determine an effective swap weight for each cell that is part of the subset of the plurality of cells associated with the particular timing path.

11. The intelligent cell swapper of claim 10, further comprising:

an effective swap weight reorder section configured to reorder the subset of the plurality of cells associated with the particular timing path in order of the effective swap weight; and a cell swapper configured to swap a cell class of a cell having the highest effective swap weight from among the reordered subset of the plurality of cells, with a new cell class from among the plurality of cell classes.

12. The intelligent cell swapper of claim 11, wherein: the swapped cell list is configured to store the new cell class of the cell.

13. The intelligent cell swapper of claim 12, wherein: the slack updater is configured to update the slack on the particular timing path; and the effective swap weight calculator section is configured to recalculate an effective swap weight for the cell having the new cell class.

14. The intelligent cell swapper of claim 13, wherein the intelligent cell swapper logic section is configured to remove the cell having the new class from consideration.

15. The intelligent cell swapper of claim 13, wherein the particular timing path is referred to as a first particular timing path, the intelligent cell swapper further comprising:

an iteration section configured to increment an index of the list of the plurality of timing paths, and to select a second particular timing path for evaluation.

16. The intelligent cell swapper of claim 15, wherein:

the cell list is referred to as a first cell list;

the subset is referred to as a first subset; and the cell list creator is configured to create a second cell list including a second subset of the plurality of cells for the second particular timing path from among the plurality of timing paths.

* * * * *